(12) United States Patent
Khenkin et al.

(10) Patent No.: US 11,674,995 B2
(45) Date of Patent: Jun. 13, 2023

(54) SYSTEM AND METHOD FOR SEMICONDUCTOR DEVICE RANDOM TELEGRAPH SEQUENCE NOISE TESTING

(71) Applicant: Cirrus Logic International Semiconductor Ltd., Edinburgh (GB)

(72) Inventors: Aleksey S. Khenkin, Austin, TX (US); John C. Tucker, Austin, TX (US); John L. Melanson, Austin, TX (US); Jeffrey A. Weintraub, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 161 days.

(21) Appl. No.: 17/148,371

(22) Filed: Jan. 13, 2021

(65) Prior Publication Data
US 2022/0221505 A1    Jul. 14, 2022

(51) Int. Cl.
*G01R 31/26* (2020.01)
*G01R 31/28* (2006.01)

(52) U.S. Cl.
CPC ..... *G01R 31/2646* (2013.01); *G01R 31/2875* (2013.01); *G01R 31/2877* (2013.01)

(58) Field of Classification Search
None
See application file for complete search history.

(56) References Cited

U.S. PATENT DOCUMENTS

| | | | |
|---|---|---|---|
| 9,723,578 B2 * | 8/2017 | Melanson | H04W 52/32 |
| 2008/0301210 A1 * | 12/2008 | Dover | G06F 1/02 708/250 |
| 2012/0112251 A1 * | 5/2012 | Forbes | H01L 27/0924 257/E21.409 |
| 2016/0366656 A1 | 12/2016 | Melanson et al. | |

OTHER PUBLICATIONS

Hoentschel, Dr. Jan. "Low Frequency Noise (LFN) in Advanced CMOS Technologies." GF Fab1 Device Team Lead. Jan. 29, 2020. Global Foundries. pp. 1-68.

* cited by examiner

*Primary Examiner* — Jermele M Hollington
(74) *Attorney, Agent, or Firm* — E. Alan Davis; Huffman Law Group, PC

(57) ABSTRACT

A method for screening a semiconductor device for production of excessive random telegraph sequence (RTS) noise includes measuring noise of the semiconductor device at a first temperature, changing the temperature of the semiconductor device to a second temperature different from the first temperature, measuring noise of the semiconductor device at the second temperature, extracting a characteristic of the measured noise at the first and second temperatures (e.g., standard deviation, HMM output, frequency domain spectrum of time domain noise measurement), making a comparison of the extracted first and second noise characteristics, and making a determination whether the semiconductor device produces excessive RTS noise based on whether the comparison is above a predetermined threshold. Two different bias conditions of the device may be employed rather than, or in addition to, the two different temperatures.

25 Claims, 13 Drawing Sheets

SYSTEM AND METHOD FOR SEMICONDUCTOR DEVICE RANDOM TELEGRAPH SEQUENCE NOISE TESTING

BACKGROUND

Random telegraph sequence (RTS) noise is a form of electronic noise observed in semiconductor devices, such as diodes, transistors, integrated circuits and other semiconductor-based systems. FIG. 1 illustrates an example of RTS noise (RTN). As may be observed from FIG. 1, RTN may be characterized by step-like transitions between discrete electrical levels at random and unpredictable times. The transitions may last from several milliseconds to seconds.

RTN is theorized to be caused by the random trap and release of charge carriers at thin film interfaces or at defect sites in bulk semiconductor crystal. The trap and release of the charges may have a significant impact on the performance of a transistor (such as under a MOS gate or in a bipolar base region) which may substantially affect the output signal. The defects may be caused, for example, by manufacturing processes, such as heavy ion implantation, or by surface contamination.

In many applications, a semiconductor device needs to be tested and screened, e.g., discarded, if it produces excessive RTN. An example application that illustrates problems that may be caused by excessive production of RTN by a semiconductor device is power management. Power management circuits may need to collect very low-frequency data, presenting bandwidth requirements extending down to approximately 0.1 Hz. While thermal noise or other sources of noise may mask RTN at higher frequencies, RTN may be dominant in these very low frequencies. As a result, very low frequency bandwidth is required to test and screen semiconductor devices for RTN. Stated another way, RTS events may be infrequent; therefore, long test times may be required to increase the likelihood that RTS events are captured during the test. Long test times per device are undesirable, particularly when the number of devices that must be tested is very large, e.g., tens or hundreds of thousands.

SUMMARY

In one embodiment, the present disclosure provides a method for screening a semiconductor device for production of excessive random telegraph sequence (RTS) noise. The method includes measuring noise of the semiconductor device at a first temperature, changing the temperature of the semiconductor device to a second temperature different from the first temperature, measuring noise of the semiconductor device at the second temperature, extracting a characteristic of the measured noise at the first and second temperatures, making a comparison of the extracted first and second noise characteristics, and making a determination whether the semiconductor device produces excessive RTS noise based on whether the comparison is above a predetermined threshold.

In another embodiment, the present disclosure provides a method for screening a semiconductor device for production of excessive random telegraph sequence (RTS) noise. The method includes measuring noise of the semiconductor device at a first bias condition, changing the bias condition of the semiconductor device to a second bias condition different from the first bias condition, measuring noise of the semiconductor device at the second bias condition, extracting a characteristic of the measured noise at the first and second bias conditions, making a comparison of the extracted first and second noise characteristics, and making a determination whether the semiconductor device produces excessive RTS noise based on whether the comparison is above a predetermined threshold.

In yet another embodiment, the present disclosure provides a system for screening a semiconductor device for production of excessive random telegraph sequence (RTS) noise. The system includes a temperature sensor configured to monitor a temperature of the semiconductor device and a controller. The controller is configured to measure noise of the semiconductor device at a first temperature, change the temperature of the semiconductor device to a second temperature different from the first temperature, measure noise of the semiconductor device at the second temperature, extract a characteristic of the measured noise at the first and second temperatures, make a comparison of the extracted first and second noise characteristics, and make a determination whether the semiconductor device produces excessive RTS noise based on whether the comparison is above a predetermined threshold.

In yet another embodiment, the present disclosure provides a system for screening a semiconductor device for production of excessive random telegraph sequence (RTS) noise. The system includes a biasing circuit configured to controllably bias the semiconductor device and a controller. The controller is configured to measure noise of the semiconductor device at a first bias condition, change the bias condition of the semiconductor device to a second bias condition different from the first bias condition, measure noise of the semiconductor device at the second bias condition, extract a characteristic of the measured noise at the first and second bias conditions, make a comparison of the extracted first and second noise characteristics, and make a determination whether the semiconductor device produces excessive RTS noise based on whether the comparison is above a predetermined threshold.

DETAILED DESCRIPTION

Figure 1:
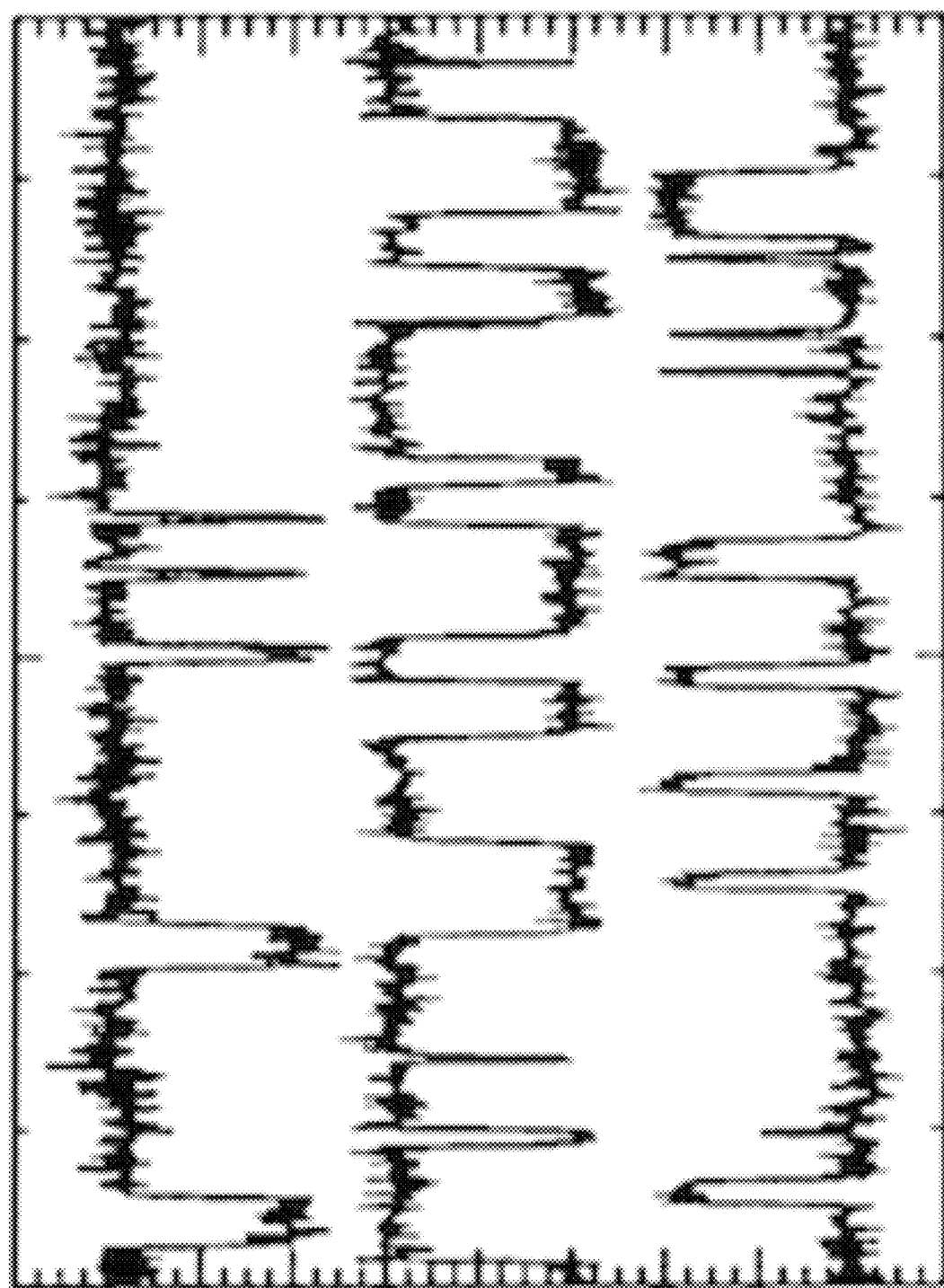
FIG. 1 is an example graph illustrating RTS noise (RTN).
Figure 2:
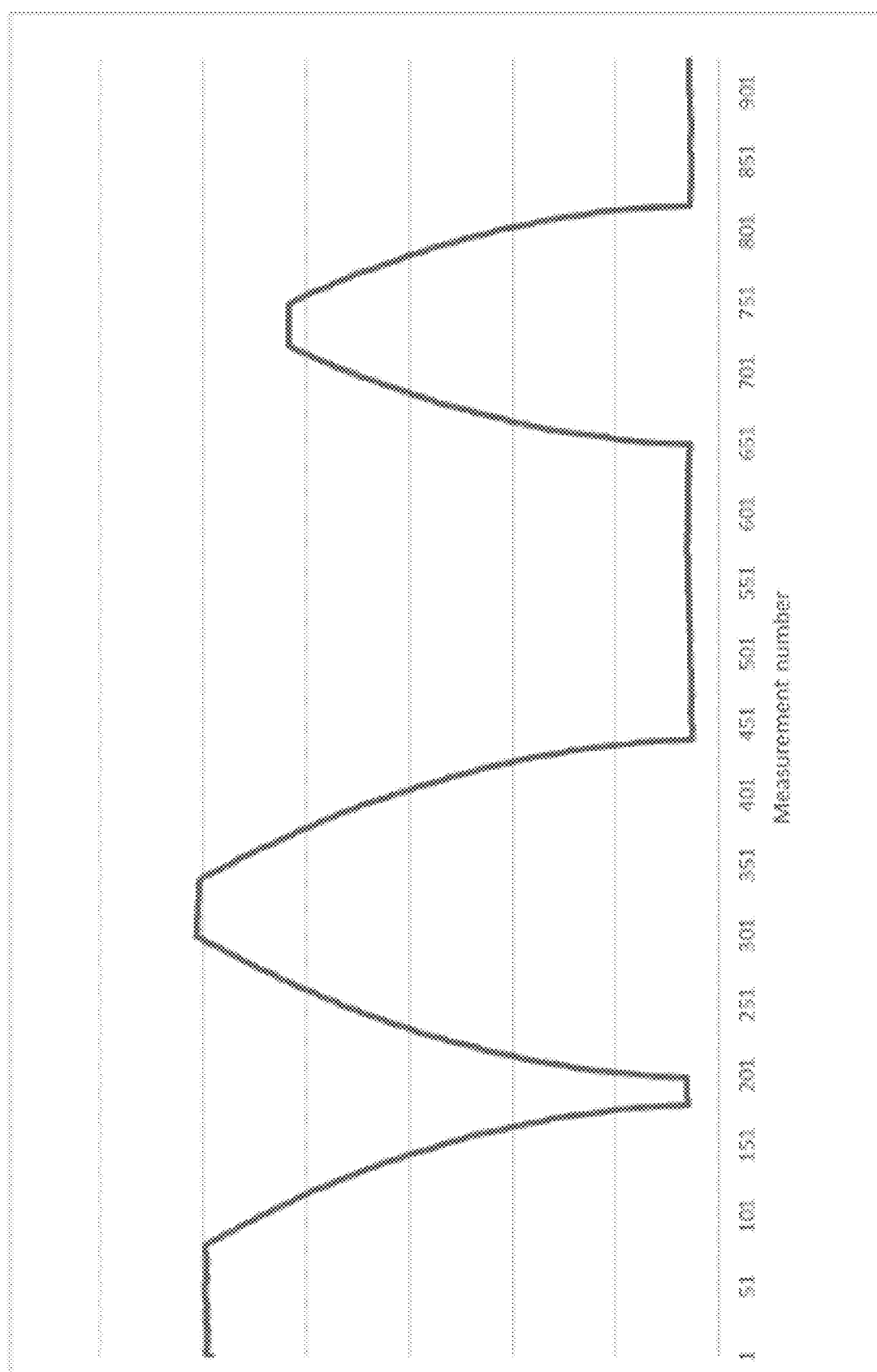
FIG. 2 is an example graph of root mean square (RMS) values of RTN.
Figure 3:
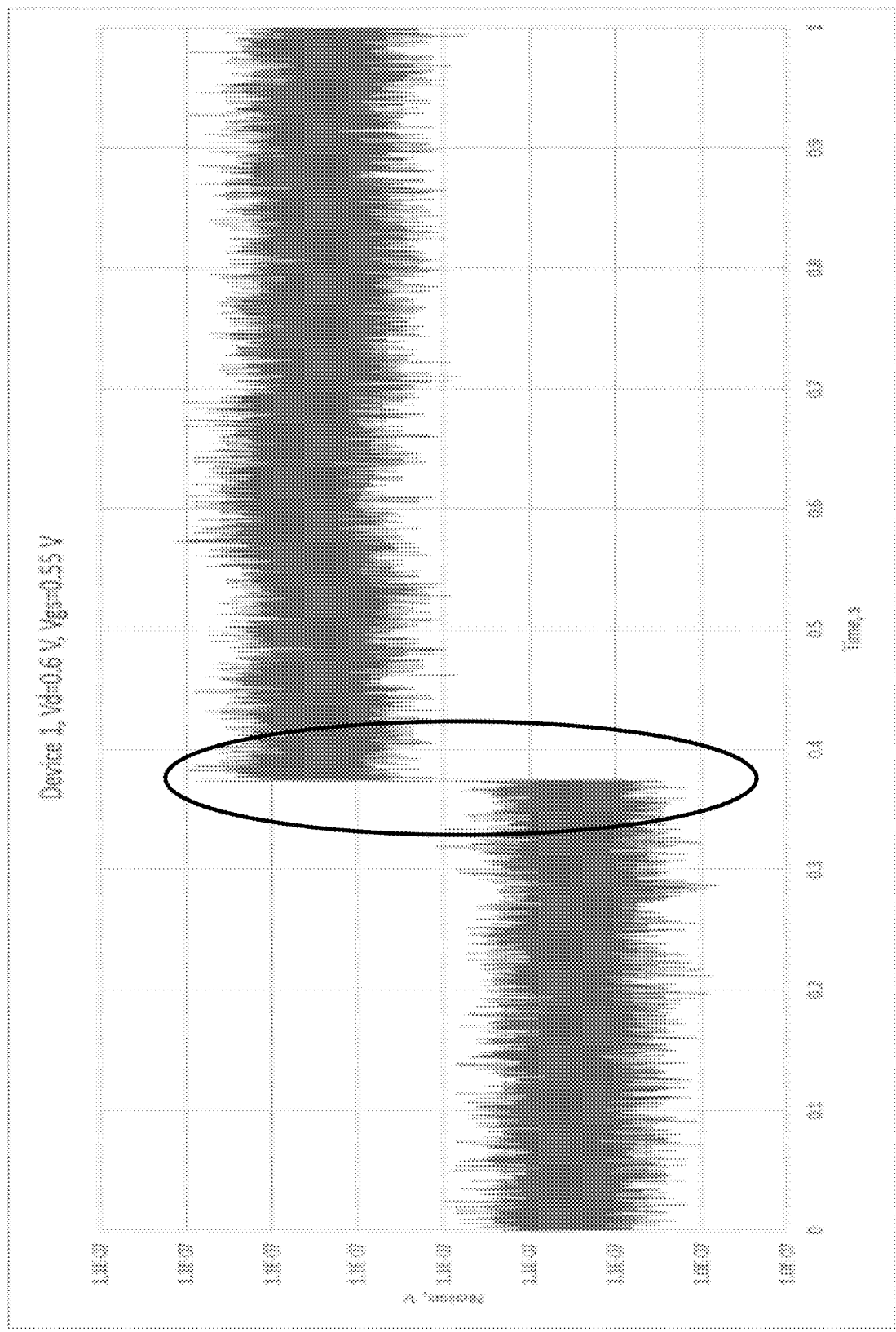
FIG. 3 is an example graph illustrating RTN.
Figure 4:
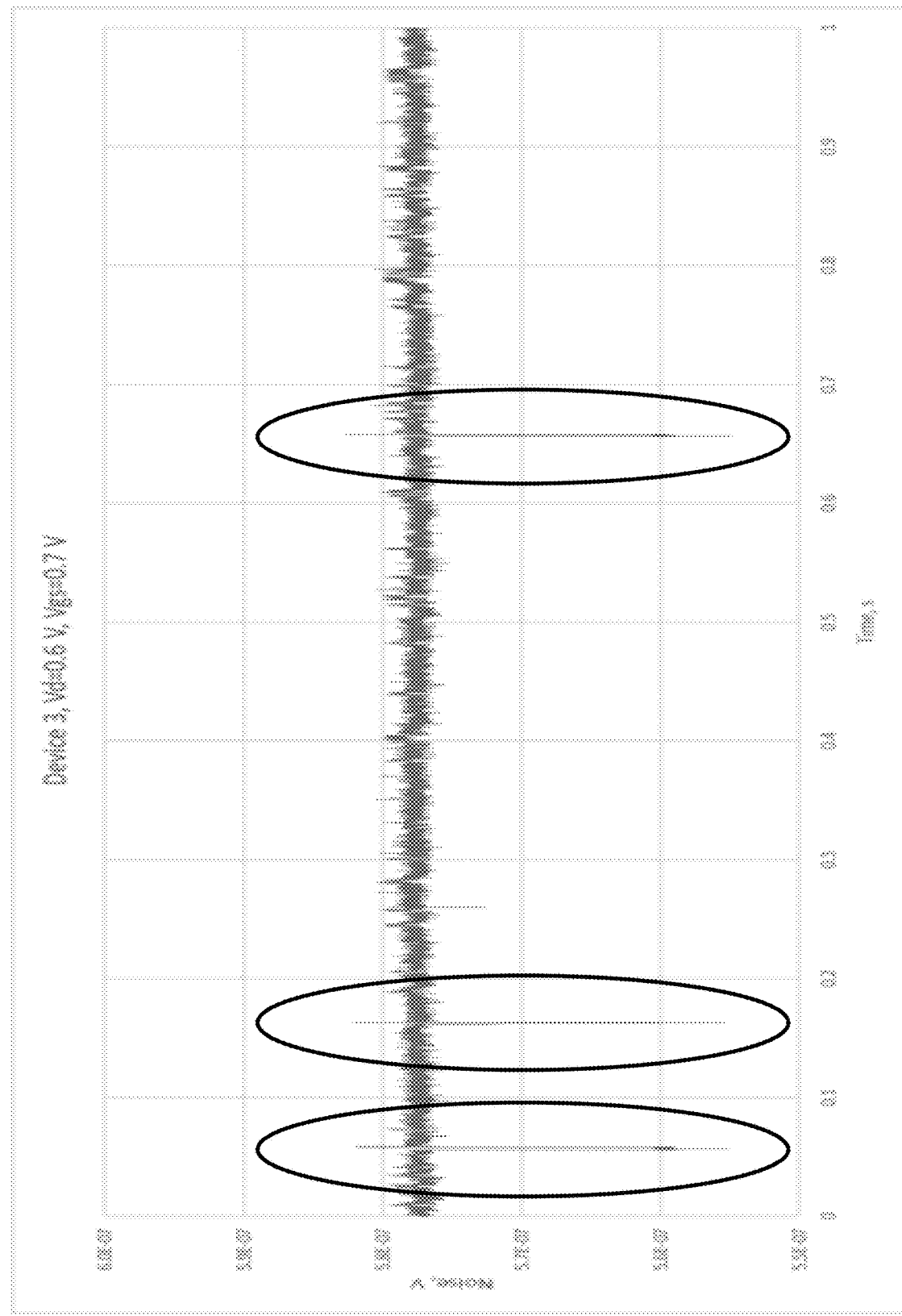
FIG. 4 is an example graph illustrating RTN.

As described above, RTS events may be both relatively infrequent and highly variable in occurrence, as illustrated by the graph of FIG. 2. Noise out of a semiconductor device may be measured as a root mean square (RMS) value. The graph of FIG. 2 shows RMS noise values measured out of a device while at room temperature (e.g., 25 degrees Celsius) with a 100-millisecond integration time for approximately 900 measurements separated by a one millisecond step. Assuming the magnitude of other noise sources is relatively constant (i.e., at the lowest level of the graph) such that the large variability is attributed to RTN, it may be observed from FIG. 2 that the results of a relatively short test interval (e.g., 100-millisecond) on such a device may be highly dependent upon when the test measurement is taken. In order to increase the likelihood of sufficiently capturing RTS events to achieve acceptable RTN false-accept/false-reject metrics of such devices, the required test time may be prohibitive. The infrequency and high variability of RTS occurrence is further illustrated by FIGS. 3 and 4 which show 1-second sweeps of noise measurements are room temperature for two different devices under two different bias conditions. As may be observed from FIGS. 3 and 4, most 100-millisecond periods do not contain RTS events, making RTN difficult to observe.

Embodiments of systems and methods of testing and screening semiconductor devices that exhibit excessive RTN are described. The embodiments rely on the observation that there is a dependence of RTN on temperature. The dependence of RTN on temperature is exploited by analyzing the difference in noise generated by the device at different temperatures. The following dependencies of RTN upon temperature have been observed as temperature increases: the RTS event occurrence rate tends to go up, RTS event duration tends to go down, and the standard deviation of RTN tends to go down. Embodiments are described that advantageously take these dependencies into account to detect devices that are likely to generate unacceptable RTN. It has also been observed that RTN characteristics depend upon the bias condition of the semiconductor device, and embodiments are also described that analyze the difference in noise generated by the device at different bias conditions to detect devices that are likely to generate unacceptable RTN.

Figure 5:
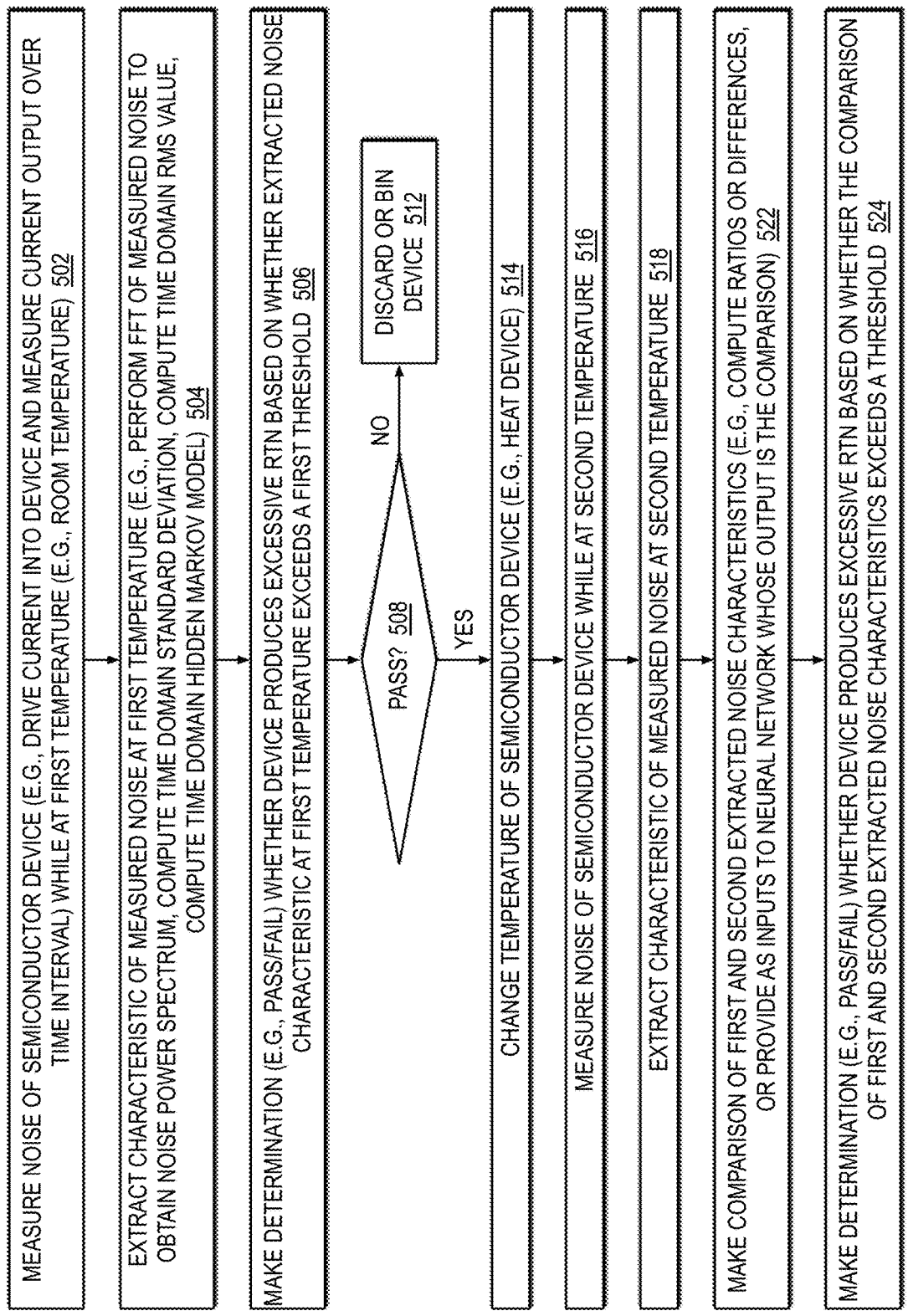
FIG. 5 is an example flow diagram illustrating a method for testing and screening a semiconductor device for excessive RTN in accordance with embodiments of the present disclosure.

FIG. 5 is an example flow diagram illustrating a method for testing and screening a semiconductor device for excessive RTN in accordance with embodiments of the present disclosure. Operation begins at block 502.

At block 502, noise is measured at the output of the semiconductor device while the device is at a first temperature. The semiconductor device may be a diode, transistor, integrated circuit or other semiconductor-based system, such as a system-on-chip. Preferably, no input signal is provided to the input of the device (e.g., the input of the device is connected to a zero-valued direct current (DC) or DC voltage) such that the electrical signal (e.g., voltage or current) generated by the device at its output is noise. The noise may be a combination of various noise sources, such as RTN, thermal noise, 1/f noise, etc. The noise at the output of the device is measured. The noise may be measured over a time interval, e.g., 100 milliseconds. Therefore, the measured noise may be a time-varying signal that may be analyzed in the frequency domain, as described in more detail below. Operation proceeds to block 504.

Figure 7:
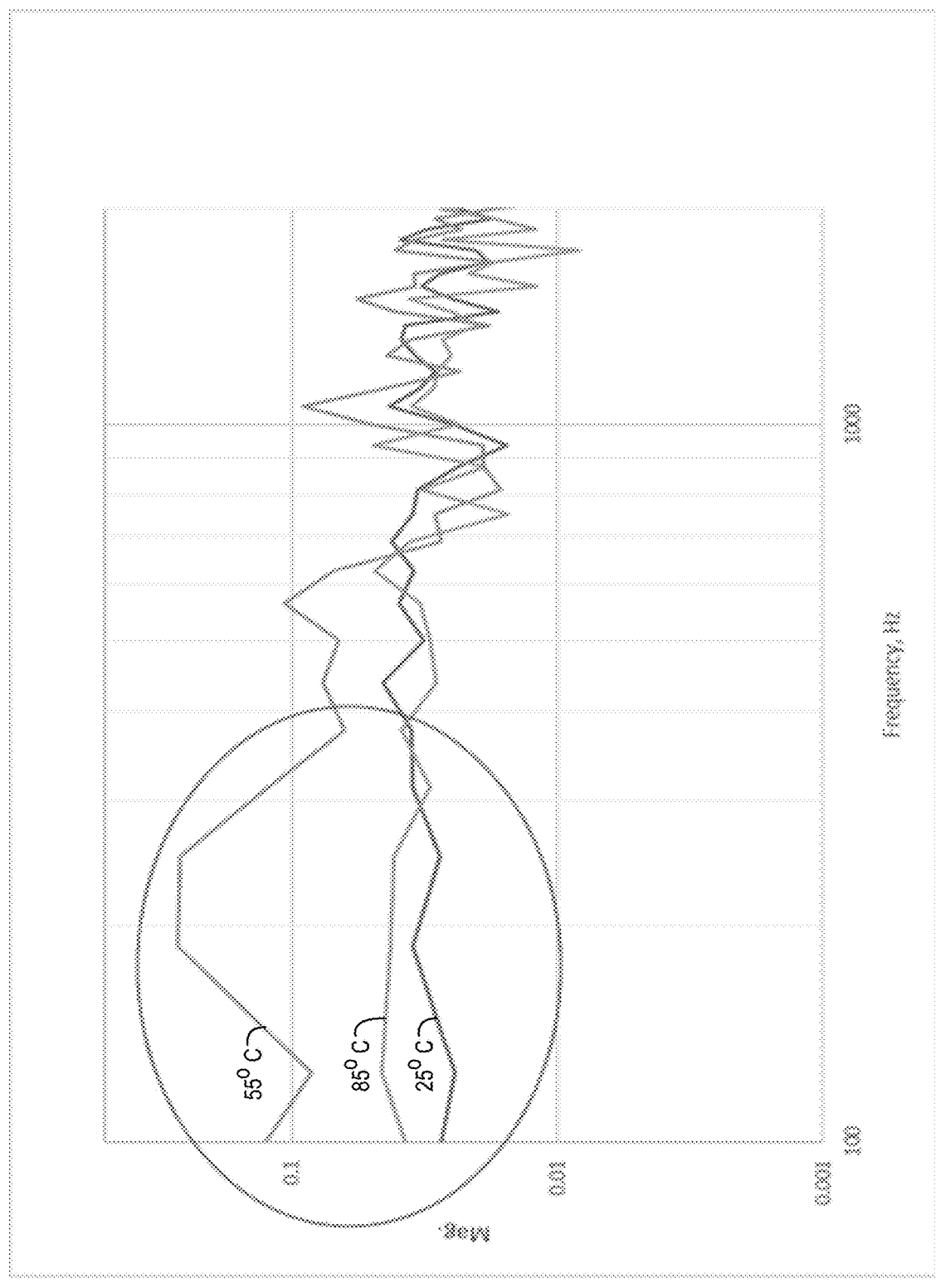
FIG. 7 is an example graph that shows the noise power frequency spectra of the noise measurements of FIG. 6 at the three temperatures in accordance with embodiments of the present disclosure.
Figure 9:
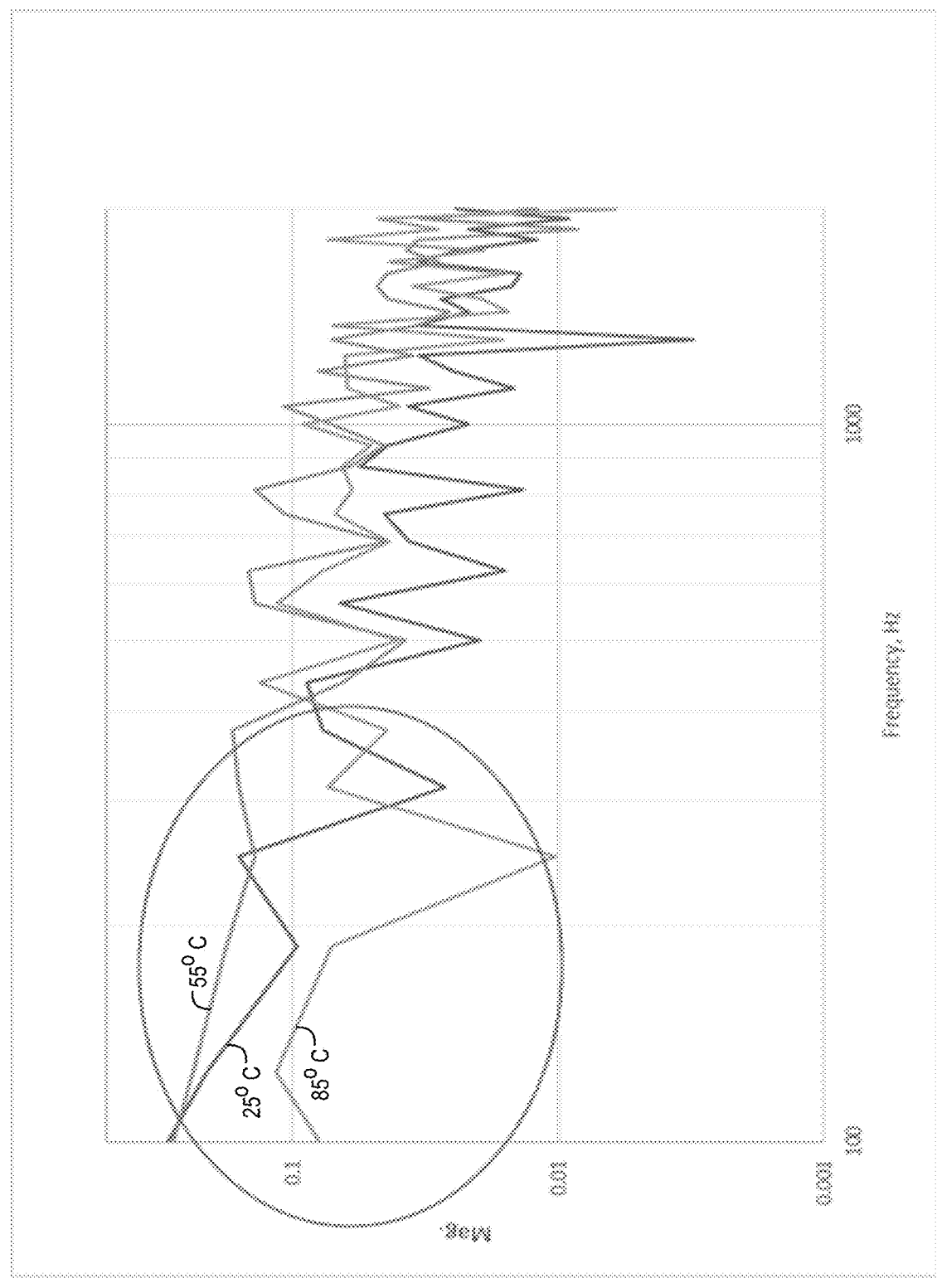
FIG. 9 is an example graph that shows the noise power frequency spectra of the noise measurements of FIG. 8 at the three temperatures in accordance with embodiments of the present disclosure.

At block 504, a characteristic of the measured noise at the first temperature is extracted. In one embodiment, the characteristic is a calculation of the standard deviation (or variance) of the measured noise over the time interval. In one embodiment, the characteristic is a calculation of a root mean square (RMS) value of the measured noise over the time interval. In one embodiment, the characteristic is a hidden Markov model (HMM) output of the measured noise over the time interval. In one embodiment, a transformation into the frequency domain (e.g., Fast Fourier Transform (FFT)) is performed on the time-varying measured noise over the time interval to generate a frequency domain spectrum, as shown in FIGS. 7 and 9. In one embodiment, the characteristic may be extracted within a range of the frequency spectrum. For example, a bandpass filter procedure associated with the frequency range may be performed on the frequency spectrum, the range-limited result may be transformed back into the time domain, and the standard deviation, RMS value, HMM output or other characteristic may be calculated using the frequency range-limited time domain result. In one embodiment, the frequency domain spectrum itself may be the extracted noise characteristic. Thus, the extracted characteristic may be a scalar value or a vector value. The frequency range may be determined by testing a sample of units of the device of interest and analyzing the frequency spectrum to determine the frequency range within which the comparison (e.g., difference or ratio) most clearly indicates a noise change that may be attributable to RTN, as described in more detail below. Operation proceeds to block 506.

At block 506, a determination is made whether the device produces excessive RTN. That is, a determination is made whether the device passes or fails the RTN test. Preferably, the determination is made based on whether the noise characteristic extracted at block 504 exceeds a first predetermined threshold. Operation proceeds to decision block 508.

At decision block 508, if the determination made at block 506 is that the device passed, operation proceeds to block 514; otherwise, the device is discarded at block 512, or the device may be binned for use or sale in less stringent applications that may tolerate the excessive RTN.

Figure 6:
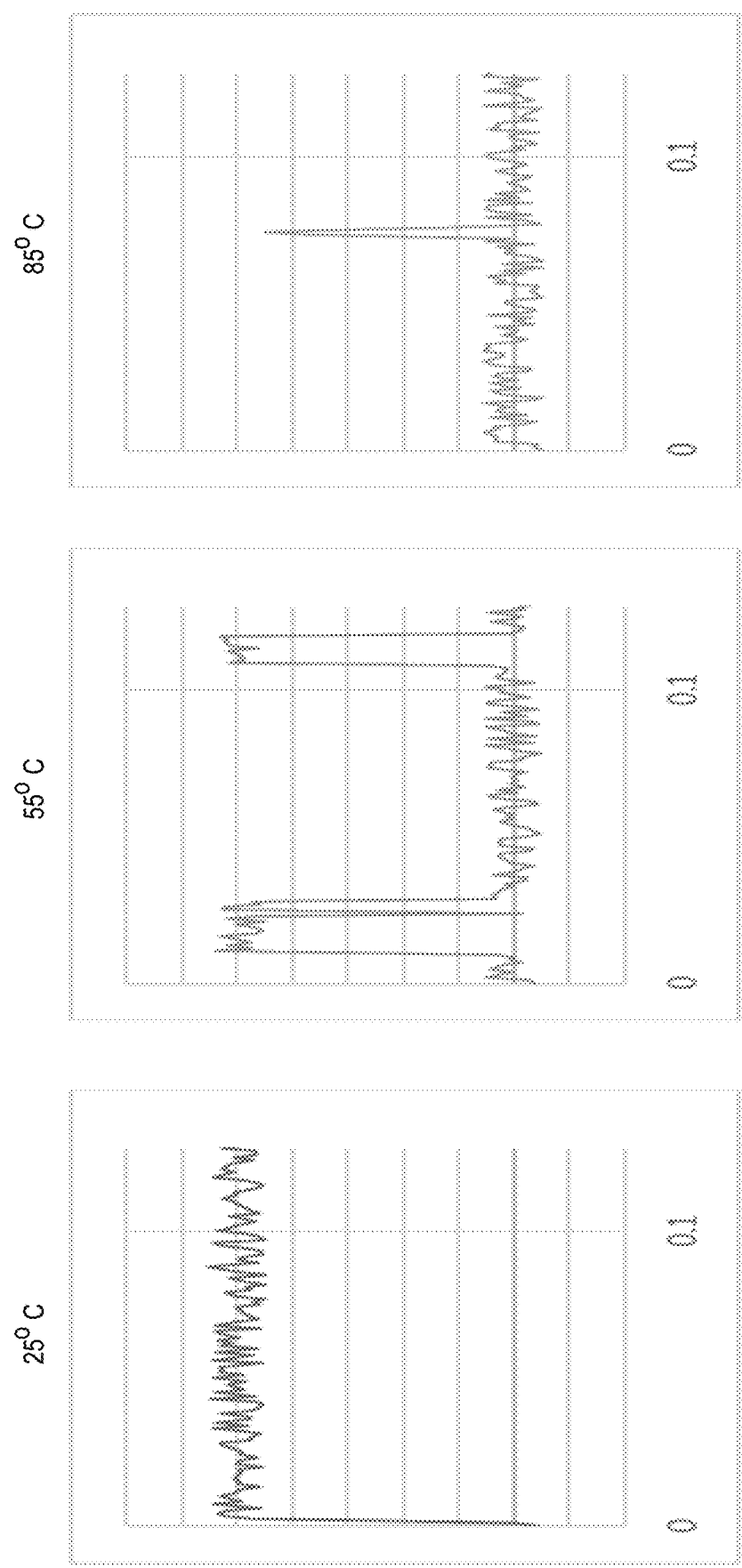
FIG. 6 is an example of three graphs that show simulated noise measurements for a measurement interval at three different temperatures in accordance with embodiments of the present disclosure.

At block 514, the temperature of the device is changed to a second temperature different from the first temperature. Preferably, the first temperature is room temperature, and the device is heated up to the second temperature that is elevated above room temperature. Embodiments of a system are described for heating the device. As described above, generally speaking, heating the device to increase its temperature may tend to increase the RTS occurrence rate within limits, as illustrated in FIG. 6, and therefore tend to increase the likelihood that an RTS event will be included within a noise measurement interval, e.g., at blocks 502 and 516.

However, other embodiments are contemplated in which the device is cooled, rather than heated, to the second temperature, which may be useful if methods are discovered for cooling the device quickly and that avoid current problems associated with cooling a device, e.g., condensation. Operation proceeds to block 516.

At block 516, while the device is at the second temperature, the noise at the output of the device is measured, similar to the manner described at block 502. Operation proceeds to block 518.

At block 518, the characteristic of the measured noise at the second temperature is extracted, similar to the manner described at block 504. Operation proceeds to block 522.

At block 522, a comparison is made of the first and second extracted noise characteristics of blocks 504 and 518. In one embodiment, the comparison comprises a difference between the first and second extracted noise characteristics. In one embodiment, the comparison comprises a ratio of the first and second extracted noise characteristics. In one embodiment in which the extracted noise characteristic is a frequency domain spectrum of noise power (e.g., of FIGS. 7 and 9), the comparison may be a vector-valued comparison, and the determination made at block 524 described below may be a determination of whether a difference/ratio of the two vector values is outside an acceptance bound. In one embodiment, the comparison may be made only within a limited frequency range of the frequency spectrum (e.g., between 50 Hz and 500 Hz, although other frequency ranges are contemplated). In one embodiment, the first and second extracted noise characteristics are provided as inputs to a neural network such that the comparison may be the output of the neural network. Alternatively, the first and second time-varying noise signals measured at blocks 502 and 516 are provided as inputs to the neural network such that the neural network effectively performs the noise characteristic extraction operation of blocks 504 and 518. In one embodiment, the output of the neural network may be the determination whether the device produces excessive RTN described at block 524. Operation proceeds to block 524.

At block 524, a determination is made whether the device produces excessive RTN. That is, a determination is made whether the device passes or fails the RTN test such that the device may need to be discarded or binned if it fails the determination made at block 524. Preferably, the determination is made based on whether the comparison made at block 522 exceeds a second predetermined threshold. The second threshold is different than the first threshold used at block 506. In one embodiment, a neural network makes the determination and may also perform the operation of making the comparison of the first and second extracted noise characteristics at block 522, and in one embodiment the neural network may perform the operation of making the extraction of the noise characteristics at blocks 504 and 518.

In one embodiment, the second threshold used at block 524 and/or the first and second temperatures used at blocks 502 and 516 may be determined beforehand (e.g., before use during production test of the method of FIG. 5) by first testing a sample of units of the device of interest to obtain a subsample of the devices that exhibit excessive RTN and a subsample of the devices that do not appear to exhibit excessive RTN. Unlike the relatively small measurement intervals desirable for use during production testing that may be used subsequently at blocks 502 and 516, the subsamples may be determined by using longer measurement intervals. Once the subsamples have been obtained, operations similar to those at blocks 502 through 522 (excluding blocks 506, 508 and 512) may then be performed on the subsamples of devices to obtain their comparison, and then the comparisons of the devices of the subsamples may be analyzed to select the first threshold, the second threshold and/or the first and second temperatures. The optimum first and second threshold values and the optimum temperature increase from the first to second temperature may be dependent upon the design of the device.

In some situations, semiconductor devices may need to operate at temperatures below room temperature. Therefore, it may be necessary to test and screen them for RTN at cold temperatures, e.g., below room temperature. However, testing at cold temperatures may introduce additional test time for at least two reasons. First, colder temperatures tend to reduce the RTS occurrence rate, which may require longer test times to increase the likelihood of capturing RTS occurrences. Second, cooling a device below room temperature may take longer than heating the device and may require the availability of additional equipment that may be more expensive than equipment required to heat the device. Additionally, cooling the device may introduce additional testing problems such as condensation, which may short conductors among the device and/or electrical testing equipment.

Additionally, the subsamples of devices described above may be determined by testing at a third temperature below the first and second temperatures in which the third temperature is prohibitive to use at blocks 502 and 516 because it would require a prohibitively long measurement interval to have a sufficiently high probability of capturing RTS events. Obtaining the known subsamples beforehand at the lower/third temperature and/or longer measurement interval to determine the second threshold and/or first and second temperatures may advantageously enable inference during use of the method of FIG. 5 (e.g., during mass production test) that a device will likely produce excessive RTN at a lower temperature based on the comparison at the higher temperatures (i.e., first and second temperatures). Advantageously, the inference may alleviate the need to incur the additional time and/or expense of testing at the lower/third temperature during production test.

As may be observed from FIG. 5, the method may advantageously accomplish a goal of reducing test times while maintaining acceptable false-accept/false-reject metrics, may improve false-accept/false-reject metrics while maintaining acceptable test times, and/or a combination thereof.

In embodiments that employ a neural network, the neural network may be trained using the known-bad and suspected-good subsamples described above. The output of such a neural network may be effectively a comparison of the extracted first and second noise characteristics that may be compared with the second threshold to make the pass/fail determination. For example, the output edge of the neural network may comprise a pass node that produces a value and a fail node that produces a value; the device unit is failed if the fail node value is above the second threshold; otherwise, the device unit is passed or the device unit is retested from an inference of insufficient data. Alternatively, the output of such a neural network may be the pass/fail determination for the device, i.e., the output is the determination whether the semiconductor device produces excessive RTN, rather than merely the comparison of the extracted first and second noise characteristics. As described above, preferably the semiconductor devices of the known-bad subsample are known to produce excessive RTN at a lower/third temperature than the two temperatures, e.g., at temperatures below room temperature, for which it is prohibitively costly to perform the testing, mechanically and/or temporally.

FIG. 6 is an example of three graphs that show simulated noise measurements for measurement intervals of approximately 128 milliseconds at three different temperatures, namely 25, 55 and 85 degrees Celsius. As may be observed from FIG. 6, for the particular unit of the device design simulated, an increase in temperature from 25 degrees to 55 degrees resulted in an increase in RTS event occurrence rate, whereas an increase in temperature from 55 degrees to 85 degrees did not result in an increase in RTS event occurrence rate in the example measurement interval instances. If additional measurement interval instances for additional units of the device design reveal a similar trend, it may be determined that a good first temperature may be 25 degrees and a good second temperature may be nearer 55 degrees than 85 degrees for the device design.

FIG. 7 is an example graph that shows the noise power frequency spectra of the noise measurements of FIG. 6 at the three temperatures of FIG. 6. As may be observed from the example of FIG. 7, the temperature increase from 25 degrees to 55 degrees results in a clear disproportionate increase in the noise power in the frequency range of about 100 to 400 Hz. The increase in noise power within the frequency range may be caused by the RTN shift to higher frequencies. In some instances, the increase in the RTS event occurrence rate with the increase in temperature may be observed as an upward shift of noise power in the frequency domain of the second temperature relative to the first temperature. The increase in temperature also causes an increase in thermal noise power (e.g., approximately 10%) across the spectrum. The fact that the thermal noise power increase is relatively substantially smaller than the RTN noise power increase advantageously allows the method of FIG. 5 to detect RTN presence by comparing noise power in the frequency range at the two different temperatures.

Figure 8:
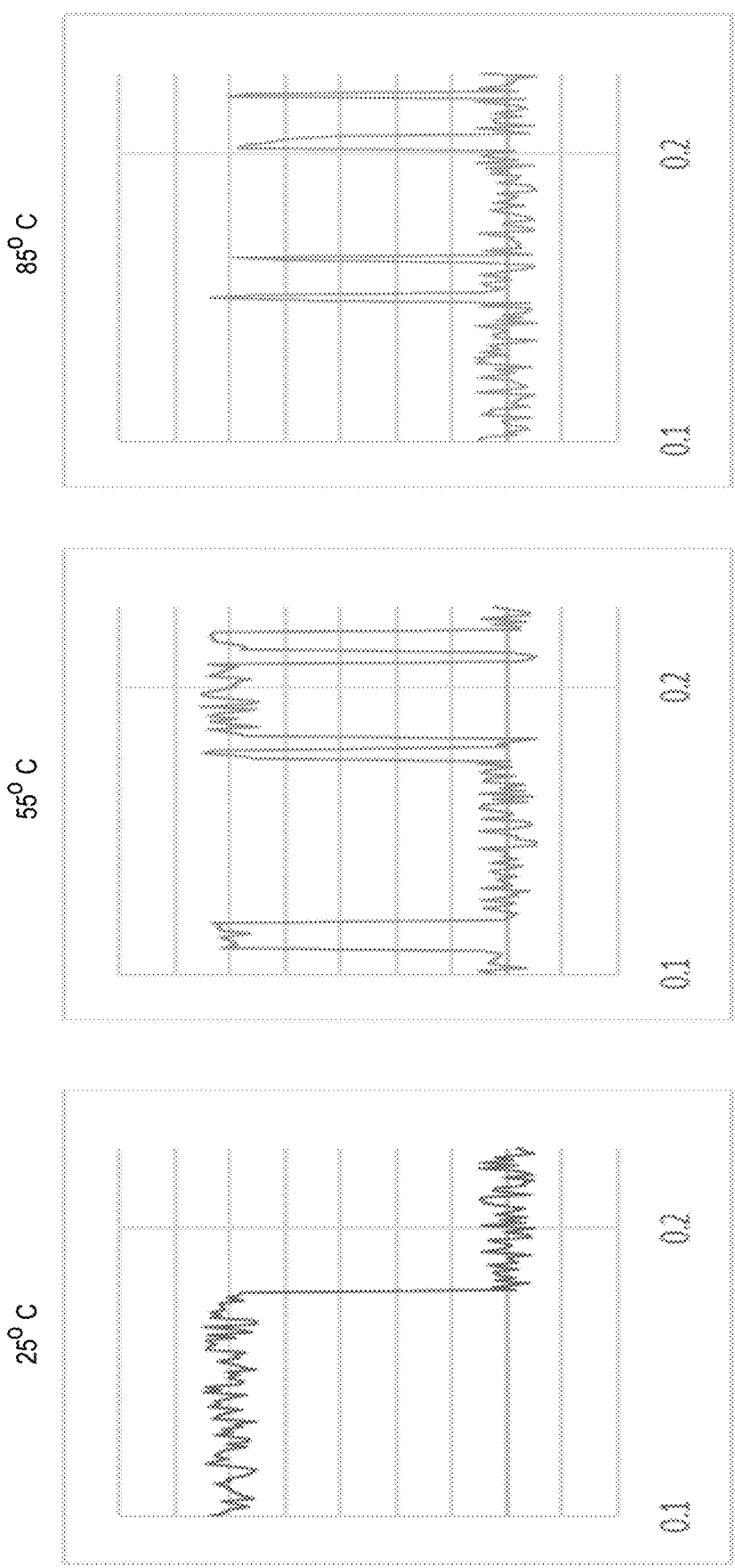
FIG. 8 is an example of three graphs that show simulated noise measurements for a measurement interval at three different temperatures in accordance with embodiments of the present disclosure.

FIG. 8 is another example of three graphs that show simulated noise measurements at the three different temperatures 25, 55 and 85 degrees Celsius, and FIG. 9 is another example graph that shows the noise power frequency spectra of the noise measurements of FIG. 8 at the three temperatures. As may be observed from the example of FIG. 9, unlike the spectra of FIG. 7, there is little difference between the spectra of 25 and 55 degrees. That is, the noise measurements at both 25 and 55 degrees indicate high levels of noise. The spectra indifference may be explained by the fact that a clear RTS event was captured within the measurement at 25 degrees, as may be observed from FIG. 8. (The spectra indifference may also be explained in part by the observation that, while increasing RTS event occurrence rate, temperature increase tends to reduce the power of each individual RTS event, as described above). This observation may make it advantageous to include the determination at block 506 of FIG. 5 to check whether the device fails the RTN test at room temperature since if an RTS event was captured in the room temperature measurement, the comparison at block 522 and determination at block 524 may not detect a failure; however, advantageously, the room temperature determination at block 506 may.

Figure 10:
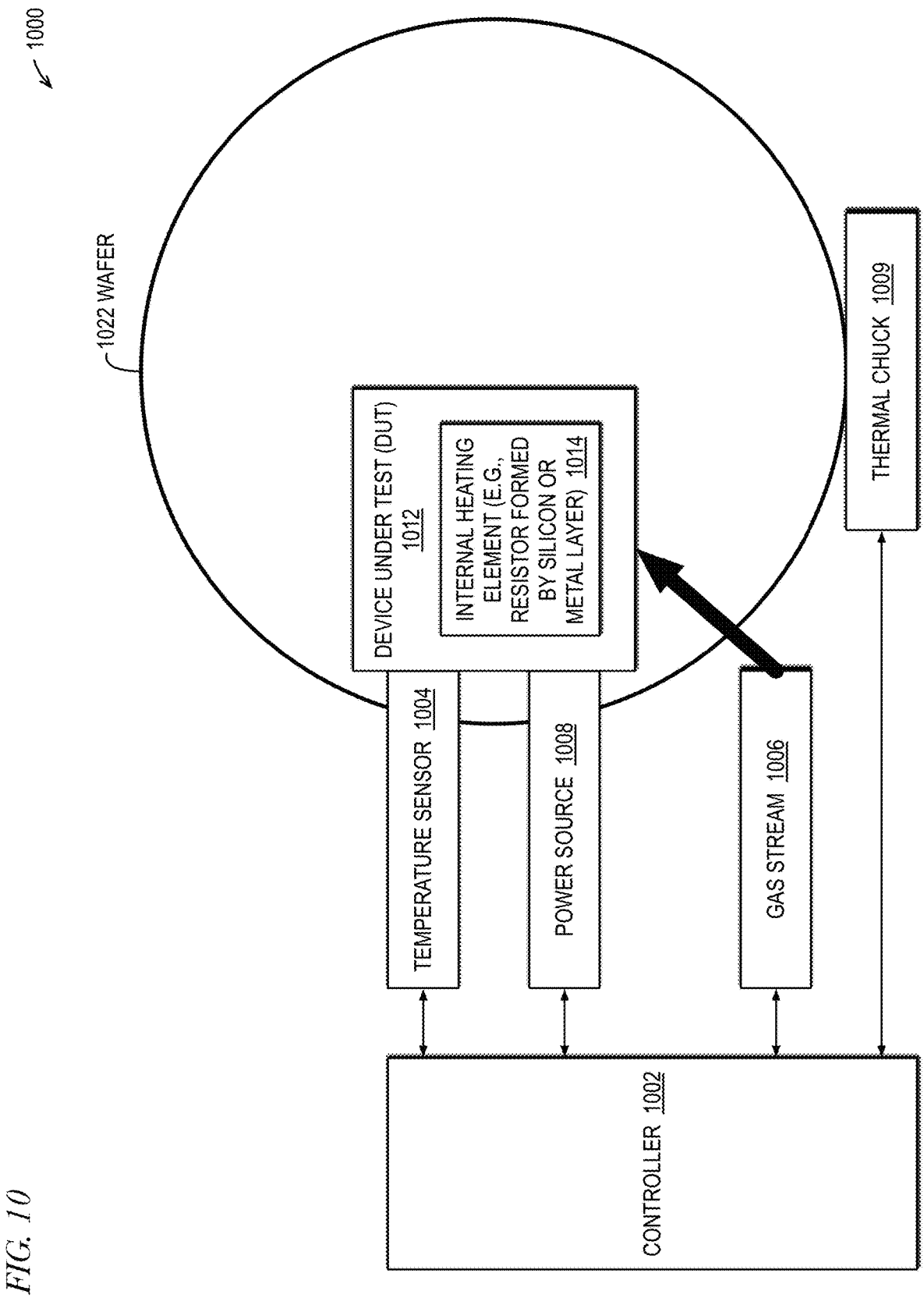
FIG. 10 is an example block diagram of a system for testing and screening a semiconductor device for excessive RTN in accordance with embodiments of the present disclosure.

FIG. 10 is an example block diagram of a system 1000 for testing and screening a semiconductor device for excessive RTN in accordance with embodiments of the present disclosure. The system 1000 may test and screen a semiconductor device under test (DUT) 1012 according to the method of FIG. 5. The DUT 1012 may include an internal heating element 1014. The internal heating element 1014 may be a resistor formed by one or more layers of metal or silicon or another material. The system 1000 includes a controller 1002 that controls a power source 1008 and/or gas stream in response to input from a temperature sensor 1004 that measures the temperature of the DUT 1012. The controller 1002 may change the temperature of the DUT 1012, e.g., as described at block 514 of FIG. 5, by selectively connecting/disconnecting the power source 1008 to/from the internal heating element 1014. The controller 1002 may alternatively or additionally change the temperature of the DUT 1012 by controlling the gas stream 1006 to selectively blow hot air onto the DUT 1012. The controller 1002 may alternatively or additionally change the temperature of the DUT 1012 by controlling the DUT 1012 to selectively operate according to its intended manner, e.g., as an amplifier. The DUT 1012 may still be located on a semiconductor wafer 1022. That is, the DUT 1012 may be tested prior to being cut from the wafer 1022. The wafer 1022 may be positioned on and substantially coupled to a thermal chuck 1009.

As described above, it has also been observed that RTN characteristics depend upon the bias condition of the semiconductor device. Embodiments will now be described that analyze the difference in noise generated by the device at different bias conditions to detect devices that are likely to generate unacceptable RTN.

Figure 11:
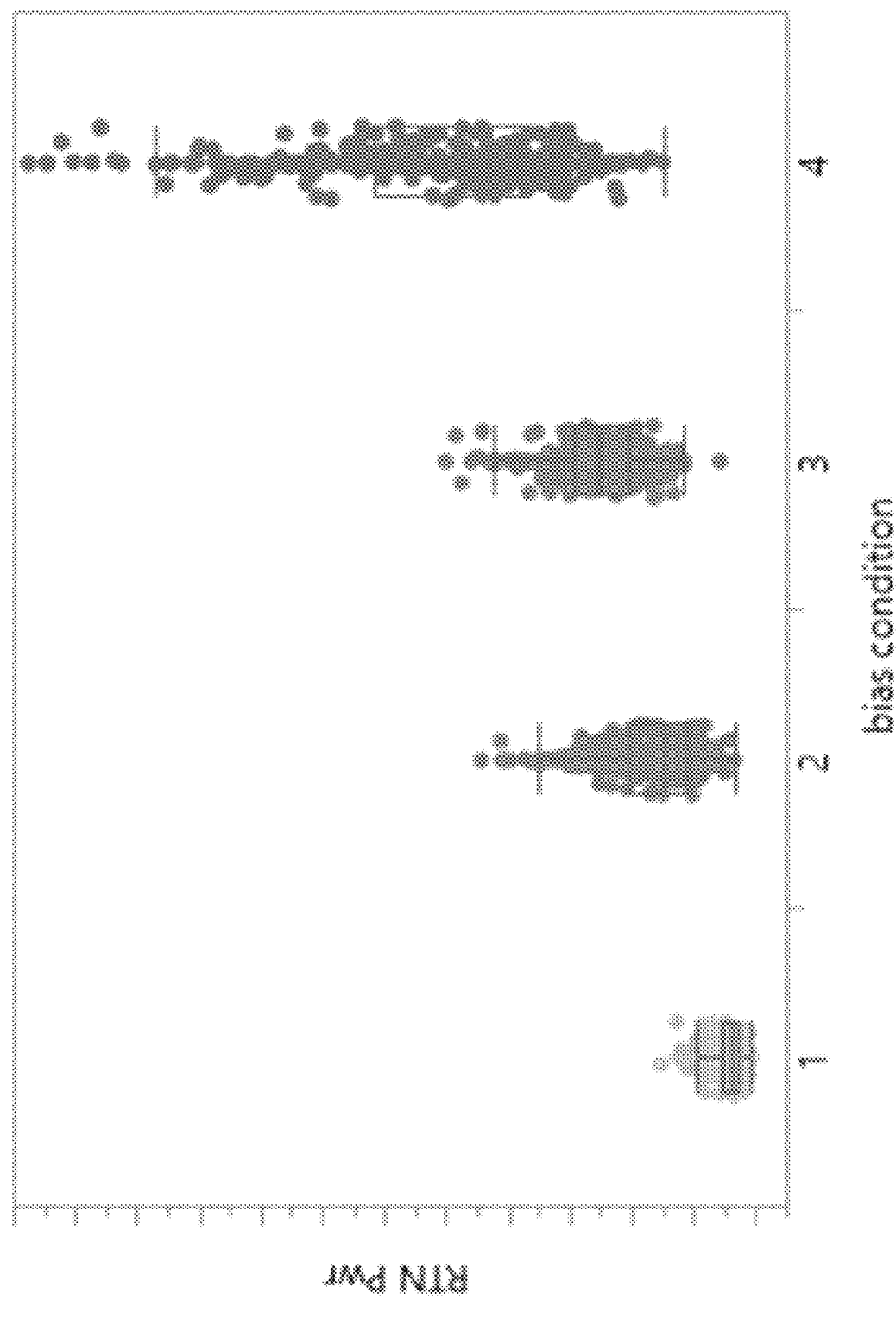
FIG. 11 is an example plot illustrating RTN power dependency upon bias condition in accordance with embodiments of the present disclosure.

FIG. 11 is an example plot illustrating RTN power dependency upon bias condition in accordance with embodiments of the present disclosure. FIG. 11 shows plots of RTN power for each of four different bias conditions. In bias condition 1, $V_g$=0.55 Volts and $V_d$=0.6 Volts. In bias condition 2, $V_g$=0.6 Volts and $V_d$=0.6 Volts. In bias condition 3, $V_g$=-0.65 Volts and $V_d$=-0.6 Volts. In bias condition 4, $V_g$=0.66 Volts and $V_d$=0.6 Volts. As may be observed, RTN power for a given device has a strong dependency on the bias condition. Advantageously, the difference in RTN power between two different bias conditions may be exploited in a manner similar to that described above with respect to analyzing differences between RTN at two different temperatures of a semiconductor device.

Figure 12:
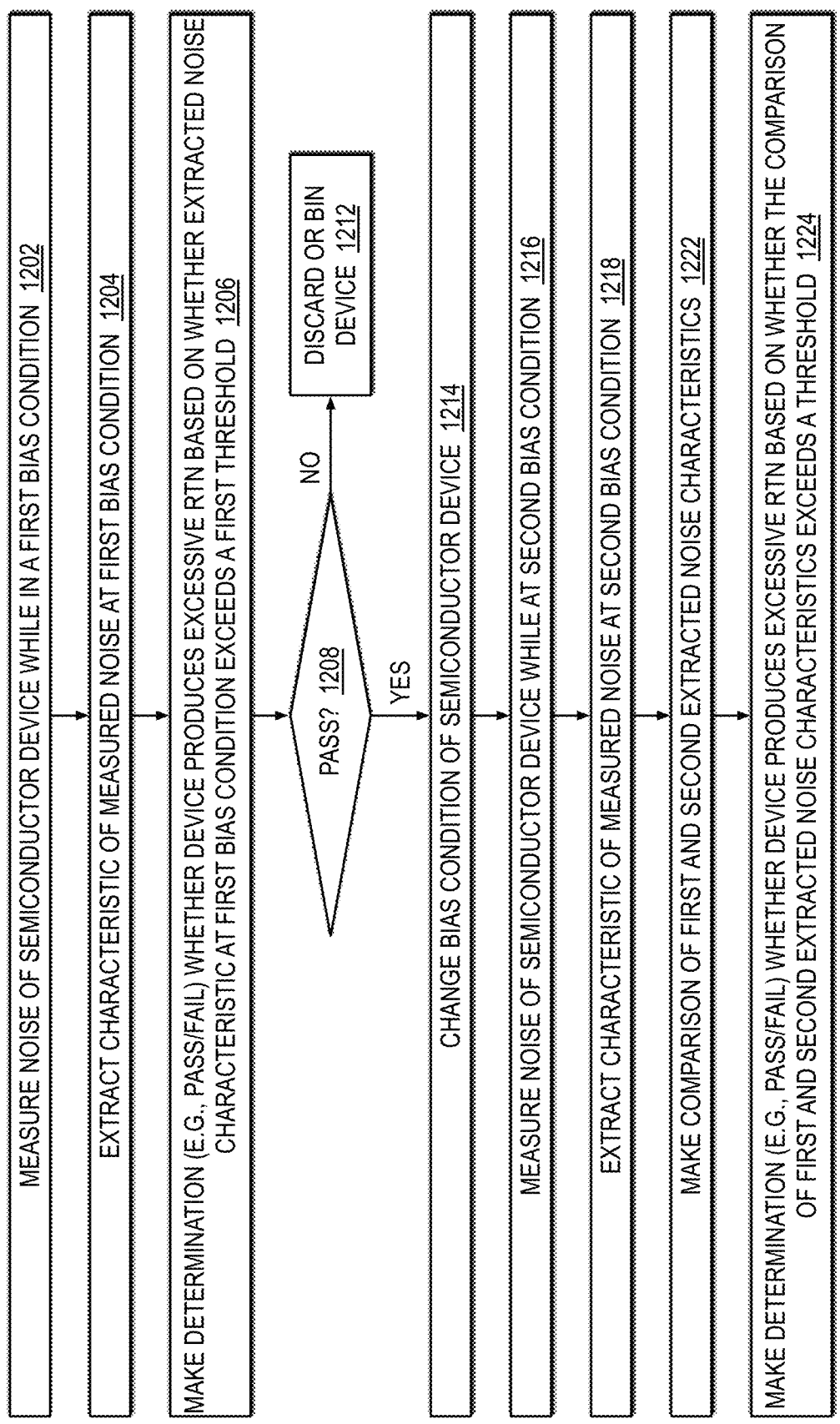
FIG. 12 is an example flow diagram illustrating a method for testing and screening a semiconductor device for excessive RTN in accordance with embodiments of the present disclosure.

FIG. 12 is an example flow diagram illustrating a method for testing and screening a semiconductor device for excessive RTN in accordance with embodiments of the present disclosure. Operation begins at block 1202.

At block 1202, noise is measured at the output of the semiconductor device while the device is in a first bias condition. The noise at the output of the device is measured. The noise may be measured over a time interval. Operation proceeds to block 1204.

At block 1204, a characteristic of the measured noise at the first bias condition is extracted. Similar noise characteristics as those described with respect to block 504 may be employed. Operation proceeds to block 1206.

At block 1206, a determination is made whether the device produces excessive RTN. That is, a determination is made whether the device passes or fails the RTN test. Preferably, the determination is made based on whether the noise characteristic extracted at block 1204 exceeds a first predetermined threshold. Operation proceeds to decision block 1208.

At decision block 1208, if the determination made at block 1206 is that the device passed, operation proceeds to block 1214; otherwise, the device is discarded at block 1212, or the device may be binned for use or sale in less stringent applications that may tolerate the excessive RTN.

At block 1214, the bias condition of the device is changed to a second bias condition different from the first bias condition. Operation proceeds to block 1216.

At block 1216, while the device is in the second bias condition, the noise at the output of the device is measured, similar to the manner described at block 1202. Operation proceeds to block 1218.

At block 1218, the characteristic of the measured noise at the second bias condition is extracted, similar to the manner described at block 1204. Operation proceeds to block 1222.

At block 1222, a comparison is made of the first and second extracted noise characteristics of blocks 1204 and 1218. Comparisons similar to those described with respect to block 522 may be employed. Operation proceeds to block 1224.

At block 1224, a determination is made whether the device produces excessive RTN. That is, a determination is made whether the device passes or fails the RTN test such that the device may need to be discarded or binned if it fails the determination made at block 1224. Preferably, the determination is made based on whether the comparison made at block 1222 exceeds a second predetermined threshold. The second threshold is different than the first threshold used at block 1206. In one embodiment, a neural network makes the determination and may also perform the operation of making the comparison of the first and second extracted noise characteristics at block 1222, and in one embodiment the neural network may perform the operation of making the extraction of the noise characteristics at blocks 1204 and 1218.

As with the temperature change embodiments described above with respect to FIGS. 2 through 10, the second threshold used at block 1224 and/or the first and second bias conditions used at blocks 1202 and 1216 may be determined beforehand (e.g., before use during production test of the method of FIG. 12) by first testing a sample of units of the device of interest to obtain a subsample of the devices that exhibit excessive RTN and a subsample of the devices that do not appear to exhibit excessive RTN.

Figure 13:
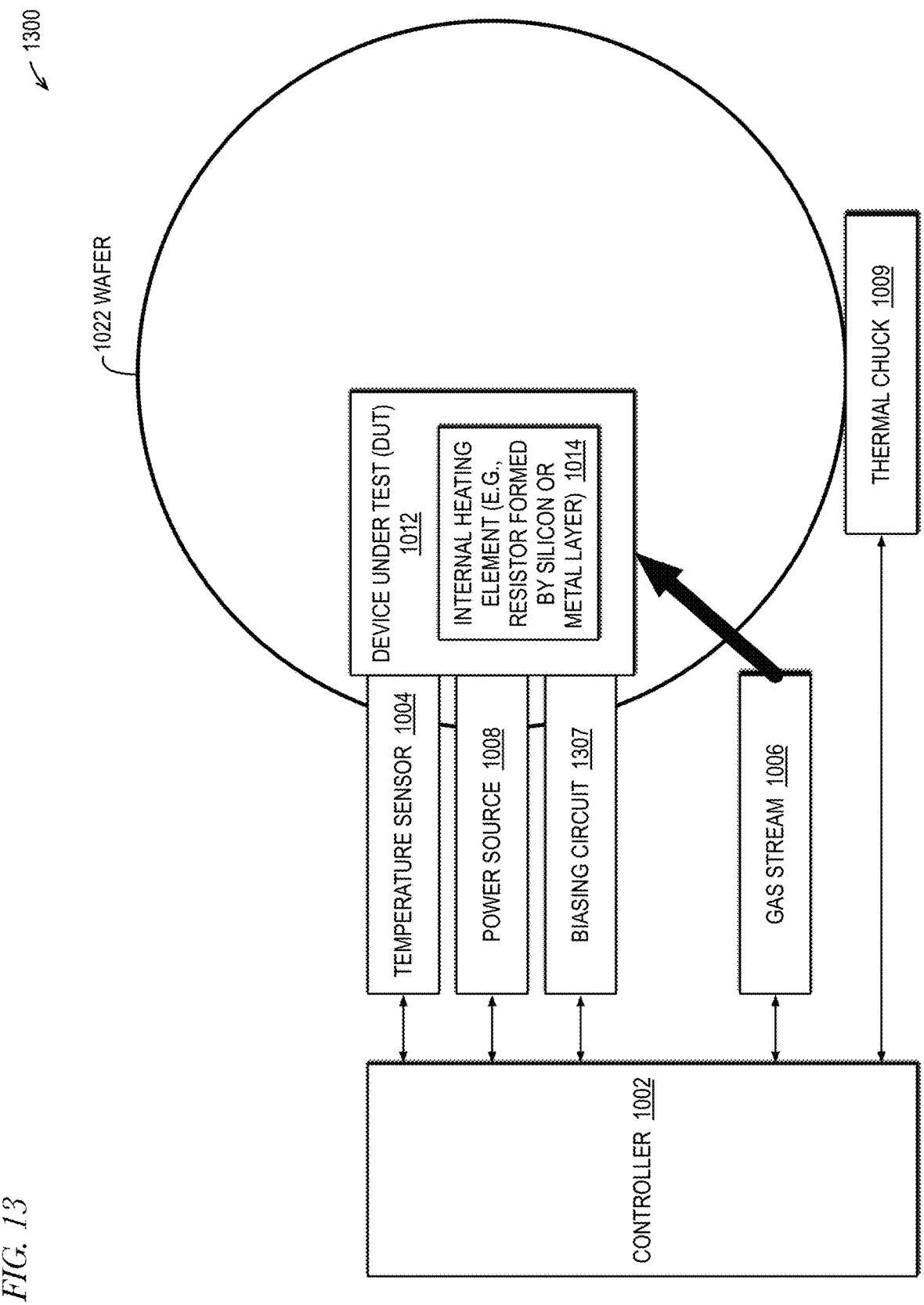
FIG. 13 is an example block diagram of a system for testing and screening a semiconductor device for excessive RTN in accordance with embodiments of the present disclosure.

FIG. 13 is an example block diagram of a system 1300 for testing and screening a semiconductor device for excessive RTN in accordance with embodiments of the present disclosure. The system 1300 may test and screen a semiconductor DUT 1012 according to the method of FIG. 12. The system 1300 may be similar in many respects to the system 1000 of FIG. 10. However, the system 1300 also includes a biasing circuit 1307 connected to the DUT 1012. The controller 1002 may control the biasing circuit 1307 to change the bias condition of the DUT 1012, e.g., as described with respect to block 1214 of FIG. 12. Embodiments are contemplated in which the system 1300 may operate according to a hybrid of the methods of FIGS. 5 and 12 in that the system 1300 may test at two different combinations of temperature and bias condition.

An advantage of the embodiments described herein is that they may reduce the time required to test a device for excessive RTN and/or increase the likelihood of detecting a device that generates excessive RTN.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A method for screening a semiconductor device for production of excessive random telegraph sequence (RTS) noise, comprising:
    measuring noise of the semiconductor device at a first temperature;
    changing the temperature of the semiconductor device to a second temperature different from the first temperature;
    measuring noise of the semiconductor device at the second temperature;
    extracting a characteristic of the measured noise at the first and second temperatures;
    making a comparison of the extracted first and second noise characteristics; and
    making a determination whether the semiconductor device produces excessive RTS noise based on whether the comparison is above a predetermined threshold;

wherein the extracted noise characteristic comprises a frequency domain spectrum transformed from a time domain measurement of the noise.

2. The method of claim 1, wherein the comparison is made within a predetermined frequency range in which the comparison tends to manifest a noise change between the first and second temperatures attributable to RTS noise.

3. The method of claim 1, wherein the extracted noise characteristic comprises at least one of:
a time domain standard deviation of the measured noise; and/or
a time domain root mean square (RMS) value of the measured noise; and/or
a time domain hidden Markov model (HMM) output of the measured noise.

4. The method of claim 1, wherein the comparison comprises an output of a neural network that receives the extracted first and second noise characteristics as input.

5. The method of claim 1, wherein the noise of the semiconductor device is measured while the semiconductor device is still located on a semiconductor wafer.

6. The method of claim 1, wherein the temperature of the semiconductor device is changed by internally heating the semiconductor device by at least one of the following methods:
operating the semiconductor device under conditions for its intended purpose such that it dissipates power; and/or
driving current through at least one metal layer of the semiconductor device; and/or
driving current through at least one internal resistor of the semiconductor device.

7. The method of claim 1, wherein the semiconductor device temperature is measured internal to the semiconductor device.

8. The method of claim 1, wherein the first temperature is room temperature and the second temperature is higher than room temperature.

9. The method of claim 1, further comprising:
if the extracted noise characteristic at the first temperature is above a second predetermined threshold:
making a determination that the semiconductor device produces excessive RTS noise and refraining from said changing the temperature of the semiconductor device to a second temperature.

10. The method of claim 1, further comprising:
selecting, a priori using a sample of units of the semiconductor device in which for each device in the sample it is determined whether or not the device produces excessive RTS noise, values of the first and second temperatures that tend to cause the comparison to approach a maximum.

11. The method of claim 1, further comprising:
testing, a priori, a sample of units of the semiconductor device to determine for each device in the sample whether or not the device produces excessive RTS noise;
wherein the testing is performed at a third temperature that is below the first and second temperatures and for a measurement interval longer than a measurement interval used to perform said measuring noise of the semiconductor device at the first and second temperatures; and
selecting, a priori using the sample, values of the first and second temperatures and/or a value of the threshold that tend to indicate the device would produce excessive RTS noise at the third temperature over the measurement interval.

12. A method for screening a semiconductor device for production of excessive random telegraph sequence (RTS) noise, comprising:
measuring noise of the semiconductor device at a first bias condition;
changing the bias condition of the semiconductor device to a second bias condition different from the first bias condition;
measuring noise of the semiconductor device at the second bias condition;
extracting a characteristic of the measured noise at the first and second bias conditions;
making a comparison of the extracted first and second noise characteristics; and
making a determination whether the semiconductor device produces excessive RTS noise based on whether the comparison is above a predetermined threshold;
wherein the extracted noise characteristic comprises a frequency domain spectrum transformed from a time domain measurement of the noise.

13. The method of claim 12, wherein the bias condition comprises at least one of a voltage from gate to source (Vgs) and a voltage from drain to source (Vds) of the semiconductor device.

14. The method of claim 12, wherein the comparison is made within a predetermined frequency range in which the comparison tends to manifest a noise change between the first and second bias conditions attributable to RTS noise.

15. The method of claim 12, wherein the extracted noise characteristic comprises at least one of:
a time domain standard deviation of the measured noise; and/or
a time domain root mean square (RMS) value of the measured noise; and/or
a time domain hidden Markov model (HMM) output of the measured noise.

16. The method of claim 12, wherein the comparison comprises an output of a neural network that receives the extracted first and second noise characteristics as input.

17. The method of claim 12, wherein the noise of the semiconductor device is measured while the semiconductor device is still located on a semiconductor wafer.

18. The method of claim 12, further comprising:
if the extracted noise characteristic at the first bias condition is above a second predetermined threshold:
making a determination that the semiconductor device produces excessive RTS noise and refraining from said changing the bias condition of the semiconductor device to a second bias condition.

19. The method of claim 12, further comprising:
wherein said measuring noise of the semiconductor device at a first bias condition is performed at a first temperature;
changing the temperature of the semiconductor device to a second temperature different from the first temperature concurrently with said changing the bias condition of the semiconductor device to a second bias condition different from the first bias condition; and
wherein said measuring noise of the semiconductor device at the second bias condition is performed at the second temperature.

20. A system for screening a semiconductor device for production of excessive random telegraph sequence (RTS) noise, comprising:

a temperature sensor configured to monitor a temperature of the semiconductor device; and
a controller configured to:
measure noise of the semiconductor device at a first temperature;
change the temperature of the semiconductor device to a second temperature different from the first temperature;
measure noise of the semiconductor device at the second temperature;
extract a characteristic of the measured noise at the first and second temperatures;
make a comparison of the extracted first and second noise characteristics; and
make a determination whether the semiconductor device produces excessive RTS noise based on whether the comparison is above a predetermined threshold;
wherein the extracted noise characteristic comprises a frequency domain spectrum transformed from a time domain measurement of the noise.

21. The system of claim 20, wherein the controller is configured to control the temperature of the semiconductor device by selectively connecting a power source of the system to a resistor of the device formed by at least one of a silicon layer or a metal layer to selectively heat the semiconductor device.

22. A system for screening a semiconductor device for production of excessive random telegraph sequence (RTS) noise, comprising:
a biasing circuit configured to controllably bias the semiconductor device; and
a controller configured to:
measure noise of the semiconductor device at a first bias condition;
change the bias condition of the semiconductor device to a second bias condition different from the first bias condition;
measure noise of the semiconductor device at the second bias condition;
extract a characteristic of the measured noise at the first and second bias conditions;
make a comparison of the extracted first and second noise characteristics; and
make a determination whether the semiconductor device produces excessive RTS noise based on whether the comparison is above a predetermined threshold;
wherein the extracted noise characteristic comprises a frequency domain spectrum transformed from a time domain measurement of the noise.

23. A method for screening a semiconductor device for production of excessive random telegraph sequence (RTS) noise, comprising:
measuring noise of the semiconductor device at a first temperature;
changing the temperature of the semiconductor device to a second temperature different from the first temperature;
measuring noise of the semiconductor device at the second temperature;
extracting a characteristic of the measured noise at the first and second temperatures;
making a comparison of the extracted first and second noise characteristics; and
making a determination whether the semiconductor device produces excessive RTS noise based on whether the comparison is above a predetermined threshold;
wherein the extracted noise characteristic comprises at least one of:
a time domain standard deviation of the measured noise; and/or
a time domain root mean square (RMS) value of the measured noise; and/or
a time domain hidden Markov model (HMM) output of the measured noise.

24. A method for screening a semiconductor device for production of excessive random telegraph sequence (RTS) noise, comprising:
measuring noise of the semiconductor device at a first bias condition;
changing the bias condition of the semiconductor device to a second bias condition different from the first bias condition;
measuring noise of the semiconductor device at the second bias condition;
extracting a characteristic of the measured noise at the first and second bias conditions;
making a comparison of the extracted first and second noise characteristics; and
making a determination whether the semiconductor device produces excessive RTS noise based on whether the comparison is above a predetermined threshold;
wherein the extracted noise characteristic comprises at least one of:
a time domain standard deviation of the measured noise; and/or
a time domain root mean square (RMS) value of the measured noise; and/or
a time domain hidden Markov model (HMM) output of the measured noise.

25. A system for screening a semiconductor device for production of excessive random telegraph sequence (RTS) noise, comprising:
a temperature sensor configured to monitor a temperature of the semiconductor device; and
a controller configured to:
measure noise of the semiconductor device at a first temperature;
change the temperature of the semiconductor device to a second temperature different from the first temperature;
measure noise of the semiconductor device at the second temperature;
extract a characteristic of the measured noise at the first and second temperatures;
make a comparison of the extracted first and second noise characteristics; and
make a determination whether the semiconductor device produces excessive RTS noise based on whether the comparison is above a predetermined threshold;
wherein the controller is configured to control the temperature of the semiconductor device by selectively connecting a power source of the system to a resistor of the device formed by at least one of a silicon layer or a metal layer to selectively heat the semiconductor device.

* * * * *